(12) United States Patent
Sugawara et al.

(10) Patent No.: US 6,548,834 B2
(45) Date of Patent: Apr. 15, 2003

(54) SEMICONDUCTOR LIGHT EMITTING ELEMENT

(75) Inventors: Hideto Sugawara, Kawasaki (JP); Koichi Nitta, Yokohama (JP); Ryo Saeki, Tokyo-To (JP); Katsufumi Kondo, Yokohama (JP); Masanobu Iwamoto, Kitakyushu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/057,283

(22) Filed: Jan. 25, 2002

(65) Prior Publication Data

US 2002/0139984 A1 Oct. 3, 2002

(30) Foreign Application Priority Data

Jan. 26, 2001 (JP) ......................................... 2001-018934

(51) Int. Cl.[7] .............................................. H01L 33/00
(52) U.S. Cl. .......................................... 257/90; 257/89
(58) Field of Search ............................... 257/79, 89, 90

(56) References Cited

U.S. PATENT DOCUMENTS

| | | | | |
|---|---|---|---|---|
| 5,771,257 A | * | 6/1998 | Takiguchi et al. | 359/248 |
| 5,801,872 A | * | 9/1998 | Tsuji | 257/17 |
| 6,084,250 A | * | 7/2000 | Justel et al. | 257/100 |
| 6,115,169 A | * | 9/2000 | Takagi et al. | 359/245 |
| 6,150,667 A | * | 11/2000 | Ishizaka et al. | 257/184 |
| 6,153,894 A | * | 11/2000 | Udagawa | 257/103 |
| 6,155,699 A | * | 12/2000 | Miller et al. | 257/95 |
| 2002/0038869 A1 | * | 4/2002 | Takaoka | 257/79 |

FOREIGN PATENT DOCUMENTS

| | | |
|---|---|---|
| JP | 09-074218 | 3/1997 |
| JP | 10-290026 | 10/1998 |

\* cited by examiner

*Primary Examiner*—Carl Whitehead, Jr.
*Assistant Examiner*—William C. Vesperman
(74) *Attorney, Agent, or Firm*—Hogan & Hartson, LLP (57) ABSTRACT

A semiconductor light emitting element is proposed that improves a light extraction efficiency without requiring any complicated processes and techniques. The semiconductor light emitting element includes an active layer for emitting first light by current injection, and a light absorbing and emitting section for absorbing a part of the first light and for emitting second light having a greater peak wavelength than the first light. A difference in peak wavelength between the first light and the second light is in a range in which a spectrum of a mixture of the first and second light maintains a unimodal characteristic or is smaller than 0.9 times a half width of the spectrum of the first light.

23 Claims, 7 Drawing Sheets

SEMICONDUCTOR LIGHT EMITTING ELEMENT

CROSS-REFERENCE TO RELATED APPLICATIONS

This application is based upon and claims the benefits of priority from the prior Japanese Patent Application No. 2001-018934, filed on Jan. 26, 2001, the entire contents of which are incorporated herein by reference.

BACKGROUND OF THE INVENTION

1. Field of the Invention

The present invention relates to generally to a semiconductor light emitting element.

2. Related Background Art

Semiconductor light emitting elements such as light emitting diodes (LEDs) and semiconductor laser diodes (LDs) have the features of small size, lightweight, low power consumption and high reliability. They are used in various applications as light sources for visible-light emitting, displaying and optical-communicating purposes. If the brightness of the light emitted increases, a range of applications as outdoor indicators and communications light sources will further increase. The materials of visible-light LEDs made practicable at present include various compound semiconductors such as AlGaAs, GaAlP, GaP and InGaAlP. They emit red, orange, yellow, green rays of light, etc., which are being supplied in low cost. Recently, blue light emitting diodes of gallium nitride compound materials have been developed, and three primary color LEDs, red LEDs, green LEDs and blue LEDs, have been already put to practical use.

Figure 9:
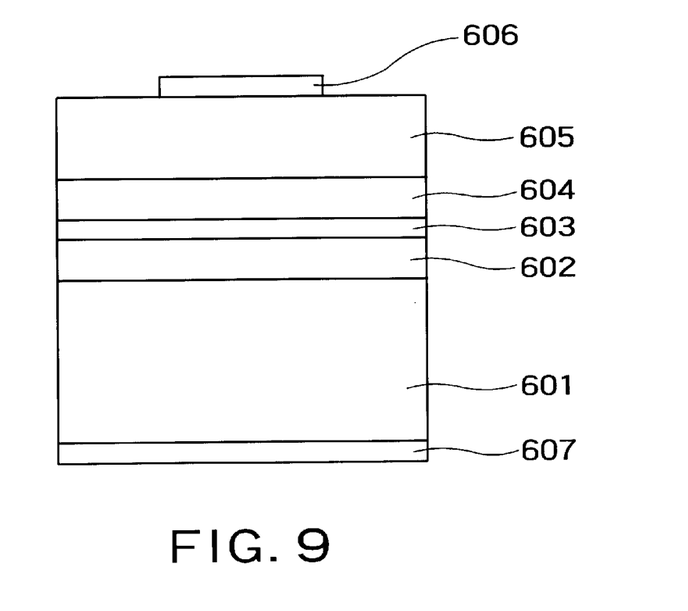
FIG. 9 is a schematic cross-sectional view of an essential portion of a conventional InGaAlP semiconductor light emitting element.

Among these materials, the InGaAlP materials have direct transitional band compositions corresponding to red-green light wavelengths. Thus, they have been developed as LED materials that provide high internal quantum efficiency in red-green colors. FIG. 9 is a schematic cross-sectional view of an essential portion of a prior art InGaAlP semiconductor light emitting element, which includes an n-type InAlP clad layer 602, a InGaAlP active layer 603, a p-type InAlP clad layer 604, a p-type GaAlAs current spread layer 605 laminated in this order on an n-type GaAs substrate 601(a) p-side electrode 606 is formed on the current spread layer 605 and an n-side electrode 607 on the back of the substrate 601. In order to grow crystals of these materials, metal-organic chemical vapor deposition (MOCVD) or molecular beam epitaxy (MBE) excellent in control of composition and film thickness is used. In growing the crystals, the GaAs substrate 601 used should match in lattice with the InGaAlP active layer 603.

In the conventional InGaAlP semiconductor light emitting element of FIG. 9, the GaAs substrate 601 is opaque to rays of light emitted from the active layer 603. Thus, the FIG. 9 element has the problem that the light extraction efficiency is not sufficiently high.

In order to increase the light extraction efficiency, a method has been proposed which includes removing the GaAs substrate 601 that absorbs rays of light emitted from the active layer 603, and providing a GaP substrate transparent to the rays of light from the active layer 603 instead. In this method, since the GaAs substrate 601 that absorbs rays of light from the active layer 603 is removed, the light extraction efficiency is improved considerably and provides the highest light output among the InGaAlP semiconductor light emitting elements provided so far. However, in order to make such composition, techniques for carefully handling thin eptaxial layers 602–605 after being removed the GaAs substrate 601(a)nd techniques for pasting the GaP substrate to a lamination of the eptaxial layers 602–605 were required. Therefore, the manufacturing process is complicated, thereby increasing the cost.

Another method has been proposed that includes forming a thick crystal layer on the active layer 603 to increase the light extraction efficiency. However, it is difficult to grow the thick crystal layer in the MOCVD or MBE, and hence this method is not so effective.

SUMMARY OF THE INVENTION

According to embodiments of the present invention, there is provided a semiconductor light emitting element comprising:

an active layer for emitting first light by current injection; and a light absorbing and emitting section for absorbing one part of the first light and for emitting second light having a greater peak wavelength than the first light.

According to embodiments of the present invention, there is provided a semiconductor light emitting element comprising:

a GaAs substrate opaque to first light having a wavelength of $\lambda$;

a light absorbing and emitting section formed on said GaAs substrate and matching in lattice with said GaAs substrate, said light absorbing and emitting section comprising an alternate lamination of first and second layers, each of said first layers having a refractive index of $n_1$ and a thickness of $\lambda/4n_1$, each of said second layers having a refractive index of $n_2$ ($n_2<n_1$) and a thickness of $\lambda/4n_2$, each of said second layers having a greater band gap than each said first layer;

a first conductive-type clad layer formed on said light absorbing and emitting section and made of a semiconductor matching in lattice with said GaAs substrate;

an active layer formed on said first conductive-type clad layer and made of a semiconductor matching in lattice with said GaAs substrate for emitting first light having a peak wavelength of $\lambda$ by current injection, said active layer having a band gap greater than each of said first layers of said light absorbing and emitting section and smaller than said first conductive-type clad layer;

said light absorbing and emitting section absorbing one part of the first light from said active layer and emitting second light having a greater peak wavelength than the first light, said light absorbing and emitting section also reflecting the remaining part of the first light from said active layer; and a second conductive-type clad layer formed on said active layer and made of a semiconductor matching in lattice with said GaAs substrate, said second conductive-type clad layer having a greater band gap than said active layer.

According to embodiments of the present invention, there is provided a semiconductor light emitting element comprising:

a substrate made of any one of sapphire, GaN and SiC;

a light absorbing and emitting section formed on said substrate and comprising an alternate lamination of first and second layers, each of said first and second layers being made of a gallium nitride compound semiconductor, each of said first layers having a refractive index of $n_1$ and a thickness of $\lambda/4n_1$, each of said second layers having a refractive index of $n_2$ ($n_2<n_1$) and a thickness of $\lambda/4n_2$, each of said second layers having a greater band gap than each said first layer;

a first conductive-type clad layer formed on said light absorbing and emitting section and made of a gallium nitride compound semiconductor;

an active layer formed on said first conductive-type clad layer and made of a gallium nitride compound semiconductors, said active layer emitting first light having a peak wavelength of $\lambda$ by current injection, said active layer having a greater band gap than each of said first layers of said light absorbing and emitting section and smaller than said first conductive-type clad layer;

said light absorbing and emitting section absorbing one part of the first light from said active layer and emitting second light having a greater peak wavelength than the first light, said light absorbing and emitting section also reflecting the remaining part of the first light from said active layer; and a second conductive-type clad layer formed on said active layer and made of a gallium nitride compound semiconductor, said second conductive-type clad layer having a greater band gap than said active layer.

According to embodiments of the present invention, there is provided a semiconductor light emitting element comprising:

a substrate made of any one of Si and GaAs, said substrate being opaque to first light having a wavelength of $\lambda$;

a light absorbing and emitting section formed on said substrate and comprising an alternate lamination of first and second layers, each of said first and second layers being made of a gallium nitride compound semiconductor, each of said first layer having a refractive index of $n_{1(a)}$ and a thickness of $\lambda/4n_1$, each of said second layers having a refractive index of $n_2$ ($n_2<n_1$) and a thickness of $\lambda/4n_2$, each of said second layers having a greater band gap than each said first layer;

a first conductive-type clad layer formed on said light absorbing and emitting section and made of a gallium nitride compound semiconductor;

an active layer formed on said first conductive-type clad layer and made of a gallium nitride compound semiconductors, said active layer emitting first light having a peak wavelength of $\lambda$ by current injection, said active layer having a greater band gap than each of said first layers of said light absorbing and emitting section and smaller than said first conductive-type clad layer;

said light absorbing and emitting section absorbing one part of the first light from said active layer and emitting second light having a greater peak wavelength than the first light, said light absorbing and emitting section also reflecting the remaining part of the first light from said active layer; and a second conductive-type clad layer formed on said active layer and made of a gallium nitride compound semiconductor, said second conductive-type clad layer having a greater band gap than said active layer.

DETAILED DESCRIPTION OF THE INVENTION

Figure 1:
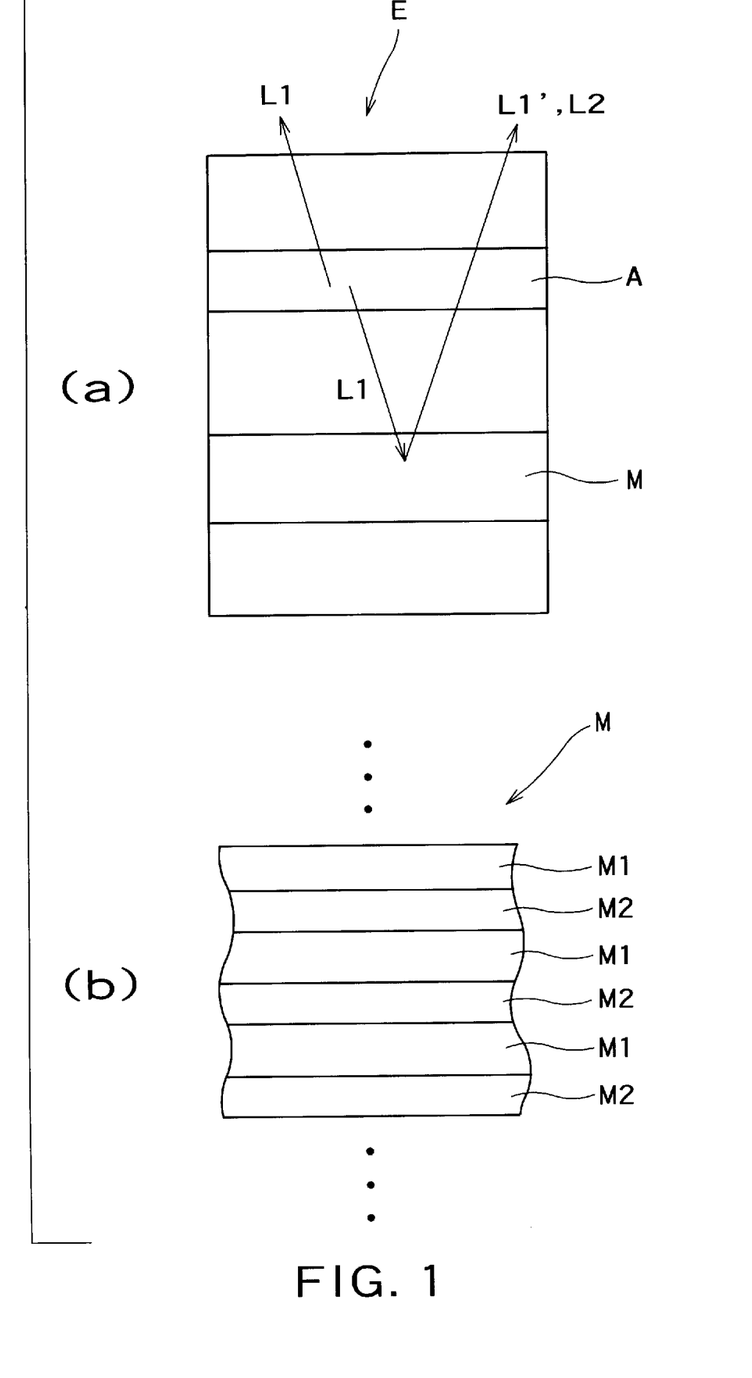
FIGS. 1(a) and 1(b) are schematic cross-sectional views of a semiconductor light emitting element according to a first embodiment of the present invention, and a light absorbing and emitting section M included in the light emitting element, respectively.

Now, referring to the accompanying drawings, the semiconductor light emitting elements according to the embodiments of the present invention will be described. As will be seen in FIG. 1, one of the features of the semiconductor light emitting elements according to the embodiments is provision of a light absorbing and emitting section M that absorbs one part of first light L1 emitted from an active layer A and emits second light L2. First, a basic composition of a semiconductor light emitting element according to each embodiment and its specific examples will be described.

First Embodiment

Referring to FIGS. 1(a) and 1(b) and 2A–2I, a semiconductor light emitting element according to the first embodiment of the present invention will be described. First, referring to FIGS. 1(a) and 1(b), the basic structure of the element will be described. Then, referring FIG. 2A and 2I, a relationship in wavelength between the first light L1 emitted from the active layer A and the second light L2 emitted from the light absorbing and emitting layer M will be described.

The basic structure of the semiconductor light emitting element according to the first embodiment will be described. FIG. 1(a) schematically illustrates the basic composition of the semiconductor light emitting element. The semiconductor light emitting element E includes an active layer A and a light absorbing and emitting layer M. The active layer A emits first light L1 having a wavelength of $\lambda$ by current injection. The light absorbing and emitting layer M absorbs one part of the first light emitted by the active layer A to excite carriers, which are then recombined to emit second light L2 having a greater wavelength than the first light L1. The light absorbing and emitting section M reflects the remaining part of the first light L1 as a reflection L1 upward in FIG. 1(a). A mixture of the reflection L1, the first light Li', and the second light L2 is extracted upward in FIG. 1.

FIG. 1(b) schematically illustrates a part of a cross-section of the light absorbing and reflecting section M, which includes a lamination of alternate light absorbing and emitting layer (first semiconductor layer) M1 and different semiconductor layer (second semiconductor layer) M2. The semiconductor layers M2 have a greater band gap than the light absorbing and emitting layers M1. The carriers excited due to absorption of the first light L1 emitted from the active layer A are confined to within the light absorbing and emitting layers M1 having a smaller band gap than the semiconductor layers M2, and then recombined therein. As a result, emission of second light L2 takes place in the light absorbing and emitting layers M1. If the carrier density of the light absorbing and emitting layers M1 is set to a high value, a light emission efficiency of light L2 is improved, and the quantum efficiency of the element is improved. A refractive index $n_1$ of the light absorbing and emitting layers M1 is different from a refractive index $n_2$ of the semiconductor layers M2. The layers M1 and M2 have thicknesses of $\lambda/4n_1$ and $\lambda/4n_2$, respectively, so that the light absorbing and emitting section M acts as a black reflecting mirror. Thus, one part of the first light L1 is absorbed by the light absorbing and emitting section M, and the remaining part of the first light L1 is reflected by the light absorbing and emitting section M.

Referring to FIGS. 2A–2I, a relationship in wavelength between the rays of light L1nd L2 emitted from the active layer A and light absorbing and emitting layer M1 will be explained. FIGS. 2A–2I are each a graph illustrating a spectrum of the light emitted by a respective inventive semiconductor light emitting element in which the active layer A and the light absorbing and emitting layer M1 include $In_{0.5}$ $(Ga_{0.9}Al_{0.1})_{0.5}P$ and $In_{0.5}$ $(Ga_{1-x}Al_x)_{0.5}P$, respectively. In this case, the peak wavelength of the first light L1 emitted from the active layer A is about 625 nm and a half width of the spectrum is about 17 nm. The wavelength of the second light L2 emitted from the light absorbing and emitting layers M1 varies depending on Al composition x. As will be seen from the following description, the spectra of FIG. 2B–2E are preferably used in the present embodiments.

Figure 2A:
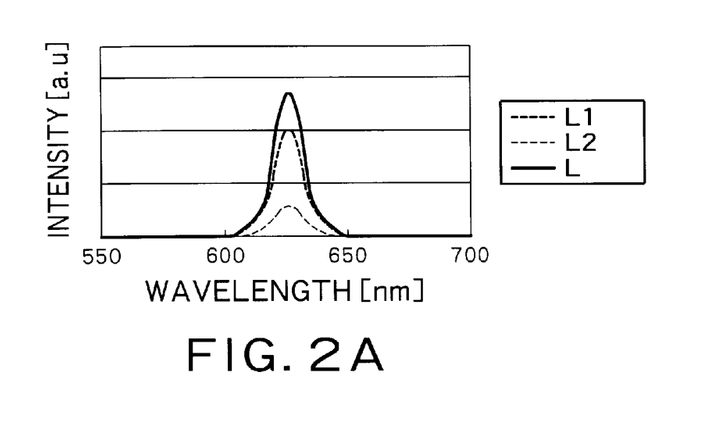
FIGS. 2A–2I are each a graph illustrating a spectrum of rays of light emitted by the semiconductor light emitting element according to the first embodiment and depending on an Al content included in the light absorbing and emitting section.

FIG. 2A illustrates the spectrum obtained when Al composition x of the light absorbing and emitting layers M1 is 0.1 or when each light absorbing and emitting layers M1 has the same composition as the active layer A. The vertical axis of FIG. 2A indicates an intensity of the light while the horizontal axis indicates a wavelength of the light. In FIG. 2A, a broken-line curve having a higher peak value represents a spectrum of the first light L1 emitted from the active layer A while another broken-line curve having a lower peak value represents a spectrum of the second light L2 emitted from the light absorbing and emitting layers M1. A solid line represents a spectrum of a mixture of the first and second light L1 and L2. AS will be seen in FIG. 2A, when the light absorbing and emitting layer M1 has the same composition as the active layer A, the wavelengths of their light have substantially the same value and their spectra coincide. In this case, since the second light L2 emitted from the light absorbing and emitting layers M1 are absorbed by the active layer A, the light extraction efficiency of the light emitting element lowers. That is, the resulting spectrum of the mixed light L indicates a unimodal characteristic and its integrated intensity is somewhat reduced on the basis of the absorption by the active layer A.

Figure 2B:
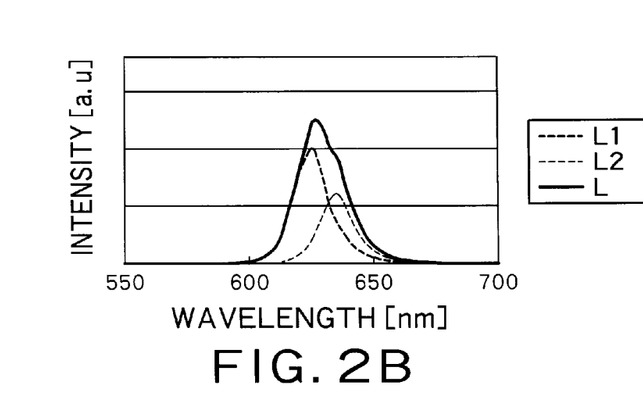

FIG. 2B illustrates spectra obtained when Al composition x is 0.050. In this case, x takes a value lower than that of the active layer A. The second light L2 emitted from the light absorbing and emitting layer M1 is about 10 nm greater in peak wavelength than the first light L1 emitted from the active layer A. In FIG. 2B, the active layer A is transparent to the second light L2 emitted from the light absorbing and emitting layers M1. Thus, the integrated intensity of the mixed light L is great compared to the case of FIG. 2A. Thus, the light extraction efficiency of the light emitting element increases to thereby improve the external quantum efficiency. In FIG. 2B, the spectrum of the mixed light L maintains a unimodal characteristic.

Figure 2C:
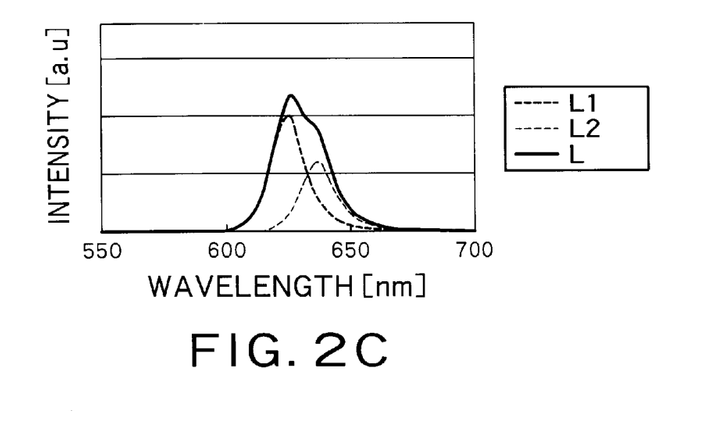

FIG. 2C shows spectra obtained when Al composition x is 0.040. In this case, the wavelength of the second light L2 emitted from the light absorbing and emitting layers Ml is about 12 nm greater in peak wavelength than the first light L1 from the active layer A. That is, in FIG. 2C the first light L1 further deviates in peak position from the second light L2 compared to FIG. 2B, although the spectrum of the mixed light L maintains a unimodal characteristic.

Figure 2D:
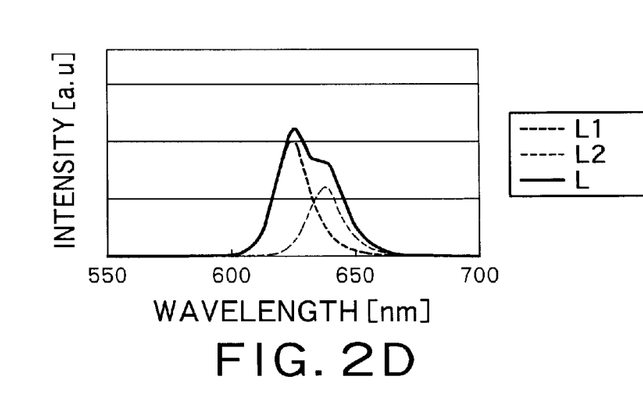

FIG. 2D illustrates spectra obtained when Al composition x is 0.035. In this case, the second light L2 emitted from the light absorbing and emitting layers M1 are about 13 nm greater in peak wavelength than the first light L1 from the active layer A. Also, in this case the spectrum of the mixed light L maintains a unimodal characteristic.

Figure 2E:
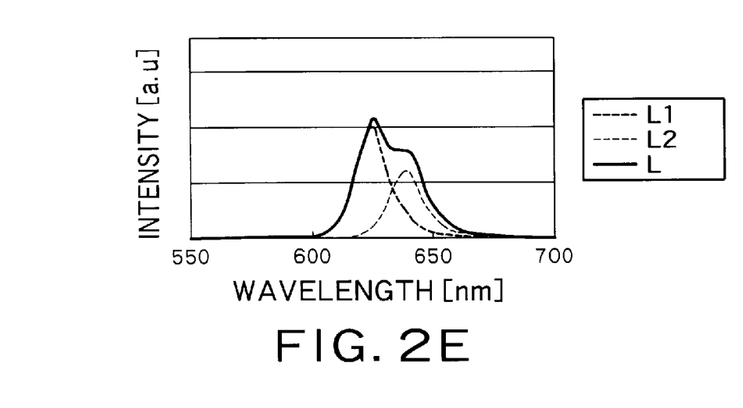

FIG. 2E illustrates spectra obtained when Al composition x is 0.030. In this case, the second light L2 emitted from the light absorbing and emitting layers M1 are about 14 nm greater in peak wavelength than the first light L1 from the active layer A. FIG. 2E also shows that the spectrum of the mixed light L is partly parallel to the x-axis. It is defined in the present specification that the spectrum of the mixed light L maintains a unimodal characteristic up to FIG. 2E.

Figure 2F:
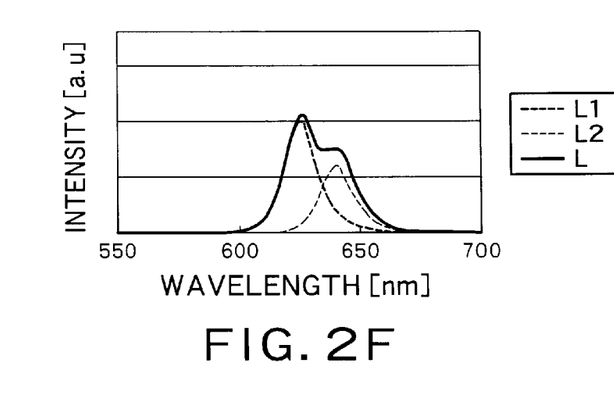

FIG. 2F illustrates spectra obtained when x is 0.025. In this case, the second light L2 emitted from the light absorbing and emitting layers M1 is about 15 nm greater in peak wavelength than the first light L1 from the active layer A. That is, the difference in peak wavelength between the first light L1 and the second light L2 is about 0.9 times about 17 nm which is a half width of the spectrum of the first light L1. FIG. 2F shows that the intensity of the spectrum of the mixed light L increases gradually from the side of its shorter wavelength to reach a first peak at about 625 nm and then decreases temporarily. Then, the intensity of the spectrum increases again to reach a second peak at about 640 nm, and then decreases gradually again. It is defined in the present specification that the spectrum of the mixed light L has a bimodal characteristic in FIG. 2F. In such a state, the monochromaticy of the mixed light L decreases.

Figure 2G:
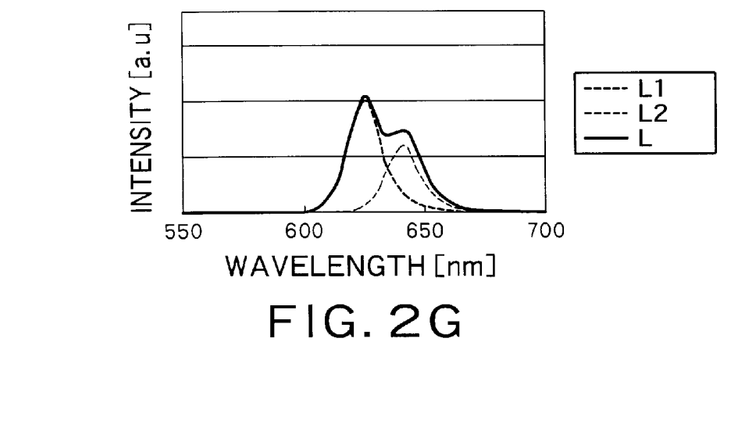

FIG. 2G illustrates the spectra obtained when Al composition x is 0.020. In this case, the second light L2 from the light absorbing and emitting layers M1 is about 16 nm greater in peak wavelength than the first light L1 from the active layer A. FIG. 2G also shows that the distance in peak position between the first light L1 and the second light L2 is greater than in the case of FIG. 2E and that the spectrum of the mixed light L shows a bimodal characteristic.

Figure 2H:
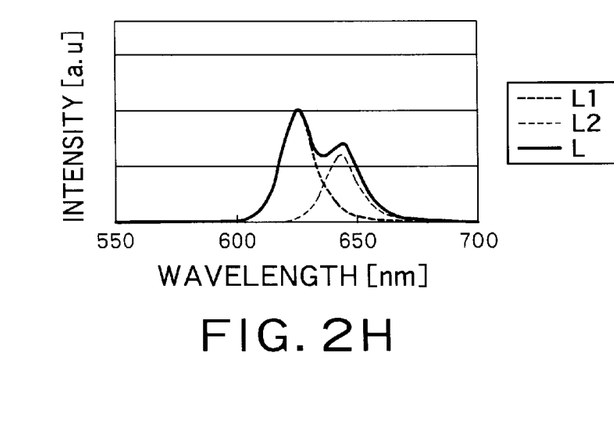

FIG. 2H illustrates the spectra obtained when Al composition x is 0.010. In this case, the second light L2 from the light absorbing and emitting layers M1 is about 18 nm greater in peak wavelength than the first light L1 from the active layer A. Like this, when the difference in peak wavelength between the first light L1 and the second light L2 is greater than about 17 nm representing a half width of the spectrum of the first light L1, the first light L1 is substantially the same in peak intensity as the mixed light L. That is, although the second light L2 is added to the first light L1, the peak intensity of the mixed light L does not increase and its monochromaticy further decreases.

Figure 2I:
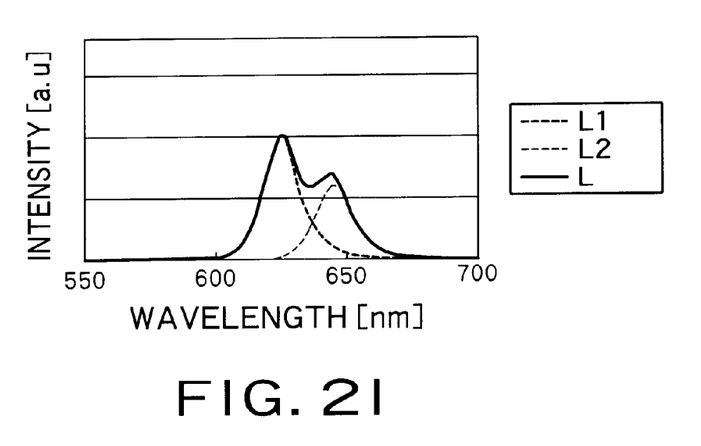

FIG. 2I illustrates the spectra obtained when x is 0. In this case, the second light L2 from the light absorbing and emitting layers M1 is about 20 nm greater in peak wavelength than the first light L1 from the active layer A. Also, in FIG. 2H the peak of the mixed light L has a bimodal characteristic.

As described above, when the difference in Al composition between the active layer A and the light absorbing and emitting layers M1 is not more than 0.07, or in the spectra of FIGS. 2A–2E, the spectrum of the mixed light L maintains a unimodal characteristic. When the Al content x is not less than 0.075, or in the case of FIG. 2F–2I, the spectrum of the mixed light L exhibits a bimodal characteristic. In this case, the monochromaticy decreases. When the difference in peak wavelength between the first light L1 and the second light L2 is greater than about 0.9 times the half width of the spectrum of the first light L1, the monochromaticy decreases. As described above, when Al composition x of the light absorbing and emitting layer M1 is less than that of the active layer A (FIGS. 2B–2E), the integrated intensity of the mixed light L is higher than when Al composition x takes the same value as that of the active layer A (FIG. 2A). That is, when the peak wavelength of the second light L2 is greater than that of the first light L1, the integrated intensity of the mixed light L increases. This teaches that use of the spectra of FIGS. 2B–2E is preferable in the present embodiment. This provides a light emitting element having an increased light extraction efficiency and improved monochromaticy.

In the semiconductor light emitting element shown in FIG. 1, since the light absorbing and emitting section M absorbs one part of first light L1 emitted by the active layer A and re-emits second light L2, the intensity of light emitted from the upper side is increased. In the semiconductor light emitting element shown in FIG. 1, since the peak wavelength of the second light L2 is selected so as to be greater than that of the first light L1 from the active layer A, the intensity of light extracted from the upper side is further increased. In the semiconductor light emitting element shown in FIG. 1, since the light absorbing and emitting section M reflects the first light L1 from the active layer A, the intensity of light emitted from the upper side is further increased. Therefore, in the semiconductor light emitting element shown in FIG. 1, the light extraction efficiency can be increased.

In the semiconductor light emitting element shown in FIG. 1, the difference in peak wavelength between the first light L1 and the second light L2 should fall in a range where the resulting spectrum of the mixed light maintains a unimodal characteristic (FIGS. 2B–2E) so that the element has an excellent monochromaticy. In other words, in the semiconductor light emitting element of FIG. 1 the difference in peak wavelength between the first light L1 and the second light L2 is selected so as to be smaller than about 0.9 that is a half width of the spectrum of the first light L1 (FIGS. 2B–2E) to thereby provide excellent monochromaticy.

While in the semiconductor light emitting element of FIG. 1 described above the light absorbing and emitting section M is illustrated as comprising a lamination of semiconductor layers, the light absorbing and emitting section M may be composed of a single semiconductor layer of a single kind.

While in the semiconductor light emitting element of FIG. 1, $In_{5.0}$ $(Ga_{0.9}Al_{0.1})_{0.5}P$ is used for the active layer A, $In_{0.5}$ $(Ga_{1-x})_{0.5}P$ is used for the light absorbing and emitting layer M1, and the wavelength of the light emitted by the active layer is 625 nm, the present invention is not limited to these specified materials and wavelength.

Second Embodiment

Figure 3:
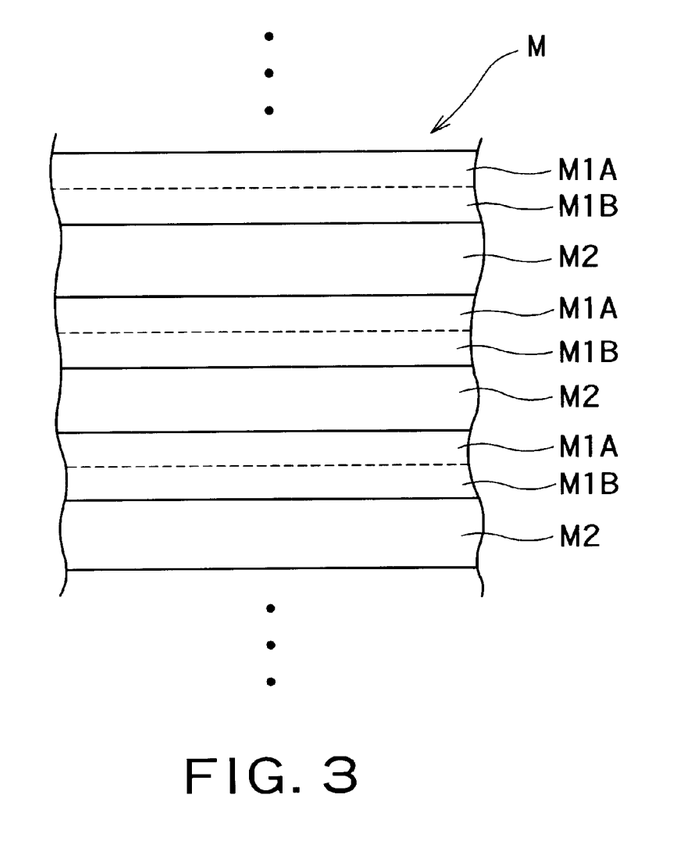
FIG. 3 is a schematic cross-sectional view of a light absorbing and emitting section M of a semiconductor light emitting element according to a second embodiment of the present invention.

As will be seen in FIG. 3, a semiconductor light emitting element according to the second embodiment is different from the semiconductor light emitting element according to the first embodiment in that each light absorbing and emitting layer M1 of the light absorbing and emitting section M includes a first light absorbing and emitting layer M1A and a second light absorbing and emitting layer M1B. Thereby the light emission efficiency of the light absorbing and emitting section M can be further increased. Since the composition of the element according to the second embodiment excluding the light absorbing and emitting section M is the same as the corresponding one of the element according to the first embodiment, further description thereof will be omitted.

FIG. 3 is a schematic cross-sectional view of the light absorbing and emitting section M of the semiconductor light emitting element according to the second embodiment. The light absorbing and emitting section M includes a lamination of first light absorbing and emitting layer M1A, second light absorbing and emitting layer M1B and semiconductor layer M2 superimposed repeatedly in this order. Each first light absorbing and emitting layer M1A serves to thin the second thinned light absorbing and emitting layer M1B. The specific details are as follows:

First light absorbing and emitting layer M1A (high refractive-index layer 1): $In_{0.5}$ $(Ga_{0.5}Al_{0.5})_{0.5}P$ Second light absorbing and emitting layer M1B (high refractive-index layer 2): $In_{0.5}(Ga_{0.95}Al_{0.5})_{0.5}P$ Semiconductor layer M2(low refractive-index layer): $In_{0.5}$ $Al_{0.5}P$ Active layer A: $In_{0.5}$ $(Ga_{0.9}Al_{0.1})_{0.5}P$ The semiconductor layer M2 acts as a low refractive-index layer while the first and second light absorbing and emitting layers M1A and M1B acts as high refractive-index layers. That is, a high refractive-index layer that composes a black reflecting mirror includes a combination of the layers M1A and M1B with a sum of thicknesses of the layers M1A and M1B being selected so as to be λ/4n, as described above. For example, each of the layers is set to λ/8n in thickness.

A reduction in the thickness of the second light absorbing and emitting layer M2 in the composition of FIG. 3 improves the carrier density of the second light absorbing and emitting layer M2 and hence the emission efficiency of the second light L2 from the second light absorbing and emitting layer M2.

EXAMPLES

Next, more detailed explanation of the embodiments will be made below by way of specific examples thereof. First and second examples address InGaAlP semiconductor light emitting elements, and third and forth examples gallium nitride compound semiconductor light emitting elements.

First Example

Figure 4:
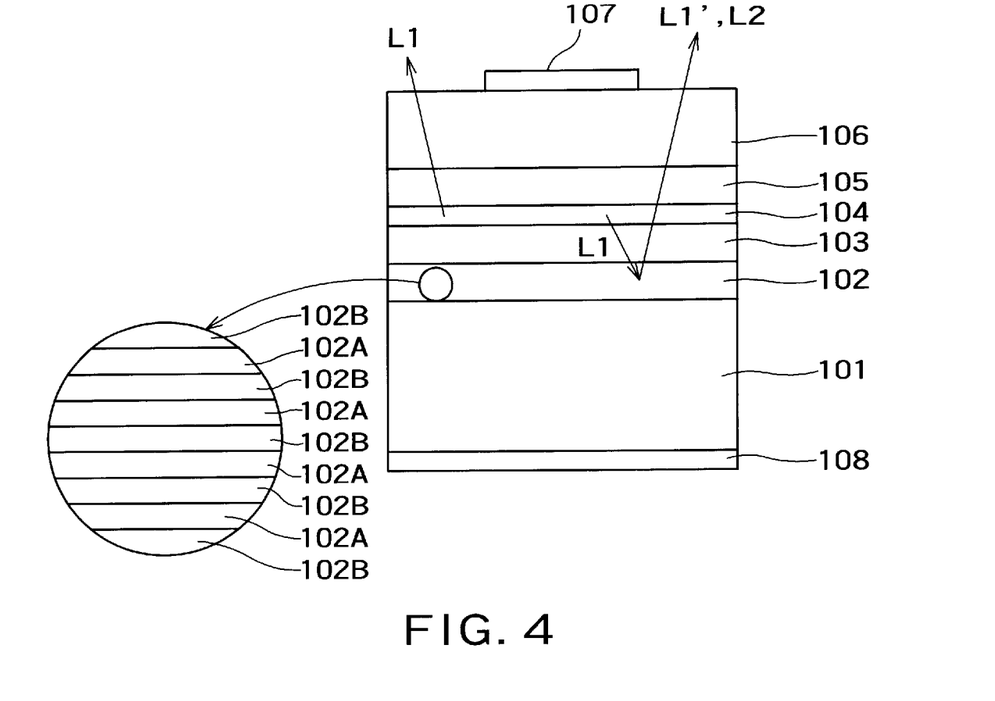
FIG. 4 is a schematic cross-sectional view of a semiconductor light emitting element taken as a first example of the invention.

The InGaAlP semiconductor light emitting element as the first embodiment will be described. FIG. 4 is a schematic cross-sectional view of an essential portion of the semiconductor light emitting element according to the first example. The semiconductor light emitting element includes a lamination of an n-type GaAs substrate 101, a multi-layered film (light absorbing and emitting section) 102, a 0.1 μm-thick n-type InAlP clad layer 103, a 0.1 μm-thick undoped $In_{0.5}(Ga_{0.9}Al_{0.1})_{0.5}P$ active layer 104, a 1 μm-thick p-type InAlP clad layer 105, and a 0.5 μm-thick p-type GaAlAs current spread layer 106, formed in this order. A p-side electrode 107 is formed on the current spread layer 106 while an n-side electrode 108 is formed on the back of the substrate 101. The active layer 104 emits first light L1 having a wavelength of λ based on a current injected through the electrodes 107 and 108. In the present example, λ is about 625 nm, which caused red light to be emitted. The n-type GaAs substrate 101 is opaque to the first light L1. Thus, the first light L1 emitted from the active layer 104 is extracted from the upper side of the element in FIG. 4. The multi-layered film 102 formed on the n-type GaAs substrate 101 includes a lamination of 30 pairs of n-type $In_{0.5}(Ga_{0.95}Al_{0.05})_{0.5}P$ layer (first layer) 102A and n-type InAlP layer (second layer) 102B. The second layer 102B is different in band gap from the first layer 102A. The second layer 102B is greater in band gap than the first layer 102A. The second layer 102B is different in refractive index from the first layer 102A. The refractive index $n_2$ of the second layer 102B is smaller than the refractive index $n_1$ of the first layer 102A. The first layer 102A has a thickness of $\lambda/4n_1$, or about 43 nm. The second layer 102B has a thickness of $\lambda/4n_2$, or about 51 nm. By selecting such thicknesses of the first and second layers, the multi-layered film 102 exhibits a high refractive index to the first light L1 having a wavelength of λ from the active layer 104. The first layer 102A is of the n-type and has a high carrier density of $1\times10^{18}$ cm$^{-3}$. The n-type InAlP clad layer 103 formed on the multi-layered film 102 has a greater band gap than the active layer 104 to confine carriers to within the active layer 104. The $In_{0.5}(Ga_{0.9}Al_{0.1})_{0.5}P$ active layer 104 formed on the n-type InAlP clad layer 103 has a greater band gap than the first layer 102A of the multi-layered film 102. Thus, one part of the first light L1 from the active layer 104 is absorbed by the multi-layered film 102, which then emits second light L2 having a greater wavelength than the first light L1. The multi-layered film 102 reflects the remaining part of the first light L1 upward from the active layer 104 as reflected light L1' in FIG. 4. The difference or distance in peak wavelength between the first light L1 and the second light L2 is in a range in which a spectrum of the mixed rays of light maintains or exhibits a unimodal characteristic, as shown in FIG. 2B. The difference or distance in peak wavelength between the first light L1 and the second light L2 is smaller than 0.9 times a half width of the spectrum of the first light L1, as shown in FIG. 2B. The p-type InAlP clad layer 105 formed on the active layer 104 has a greater band gap than the active layer 104 to confine carriers to within the active layer 104.

A method of making the semiconductor light emitting element of FIG. 4 will be explained next. All the InAlP/InGaAlP multi-layered film 102, n-type InAlP clad layer 103, InGaAlP active layer 104, p-type InAlP clad layer 105, and p-type GaAlAs current spread layer 106 of the semiconductor light emitting element shown in FIG. 4 are matched in lattice with GaAs substrate 101 and can be grown on the GaAs substrate 101. In order to form this element, MOCVD method may be used. In that case, the growing materials may be, for example, trimethylgallium or triethylgallium may be used as a Ga source; trimethylindium or triethylindium as an In source; trimethylaluminum or triethylaluminum as an Al source; phosphine or tertiarybutylphoshine as a P source, etc. Monosilane and dimethylzinc may be used as n- and p-type impurities (dopants), respectively. A process for growing the crystals will be outlined as follows. First, the GaAs substrate 101 is cleaned with an organic solvent or a sulfuric-acid or sulfuric-acid-based etchant and then inserted into a MOCVD furnace. The substrate is then heated to about 730° C., required quantities of appropriate P materials and appropriate Group III materials are fed into the furnace to sequentially grow the n-type InAlP/n-type InGaAlP multi-layered film 102, n-type InAlP clad layer 103, undoped InGaAlP active layer 104, p-type InAlP clad layer 105, and p-type GaAlAs current spread layer 106. That is, in the semiconductor light emitting element of FIG. 4, the respective layers can be formed continuously on the GaAs substrate 101 in a single crystal growth process. Then, electrodes 107 and 108 are formed to thereby finish the FIG. 4 element.

Figure 8:
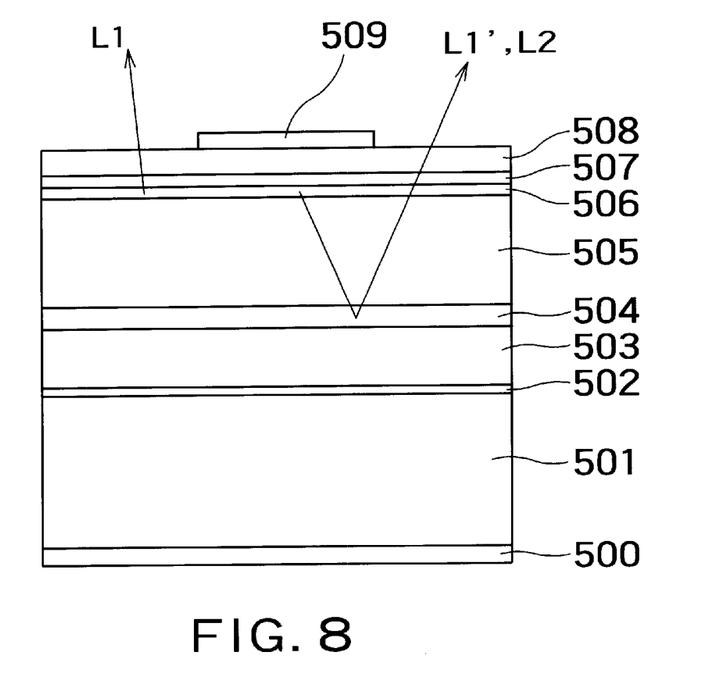
FIG. 8 is a schematic cross-sectional view of a semiconductor light emitting element taken as a fourth example of the invention.

As described above, the semiconductor light emitting element of FIG. 4 has the multi-layered film 102 to thereby increase the light extraction efficiency. In detail, in the semiconductor light emitting element of FIG. 4 the first light L1 emitted from the active layer 104 toward the substrate are reflected and absorbed by the multi-layered film 102. The first light L1 from the active layer 104, the reflected rays of light L1' from the multi-layered film 102 and the second light L2 absorbed and emitted by the multi-layered film 102 come upward from the upper side of the element in FIG. 4. Thus, an increased amount of light can be obtained from the upper side of the semiconductor light emitting element of FIG. 4 to thereby improve the light extraction efficiency. In contrast, in the conventional semiconductor light emitting element of FIG. 8 the rays of light emitted downward from the active layer 503 in FIG. 8 are absorbed by the GaAs substrate and the light extraction efficiency is low.

As shown in FIG. 2B, the second light L2 from the light absorbing and emitting layer 102A are greater in wavelength than the first light L1 from the active layer 104 in the semiconductor light emitting element of FIG. 4 to thereby increase the light extraction efficiency further. That is, the light absorbing and emitting layer 102A is lower in band gap than the active layer 104 and the second light L2 from the light absorbing and emitting layer 102A is transparent to the active layer 204 in the element of FIG. 4 to thereby increase the efficiency of extracting the rays of light out of the element. In other words, the integrated intensity of a mixture of the first and second light L1nd L2 increases to thereby improve the light quantum efficiency.

Since the first layer 102A has a high carrier density of $1\times10^{18}$ cm$^{-3}$ in the semiconductor light emitting element of FIG. 4, the intensity of the second light L2 from the light absorbing and emitting layer 102 is further increased to thereby increase the light extraction efficiency further.

As shown in FIG. 2B, since in the semiconductor light emitting element of FIG. 4 the distance in peak wavelength between the first light L1 and the second light L2 is maintained in a range in which a spectrum of the mixed light exhibits or maintains a unimodal characteristic, the monochromaticy is maintained. Since in the semiconductor light emitting element of FIG. 4 the difference or distance in peak wavelength between the first light L1 and the second light L2 is selected so as to be smaller than about 0.9 times a half width of the spectrum of the first light L1, the monochromaticy is maintained.

As described above in the making method, the epitaxial growth layers 102–106 are grown continuously on the substrate 101 in the semiconductor light emitting element of FIG. 4. Thus, provision of the multi-layered film 102 hardly influence the manufacturing time, yield and productivity.

As described above, the light extraction efficiency increases without lowering the manufacturing time, yield and productivity in the semiconductor light emitting element of FIG. 4.

The brightness of the semiconductor light emitting element shown in FIG. 4 is 8 cd under 20 mA operation in a state where the light emitting element is in a package with a radiation angle of 10°, which equals about 3 times brightness of the conventional light emitting element shown in FIG. 9.

Next, the number of laminated layers of the multi-layered film 102 of the semiconductor light emitting element of FIG. 4 will be considered. More particularly, while the multi-layered film 102 of FIG. 4 comprises 30 laminated pairs of first and second layers 102A and 102B, a possible range of laminated pairs of such first and second layers will be then considered.

Figure 5:
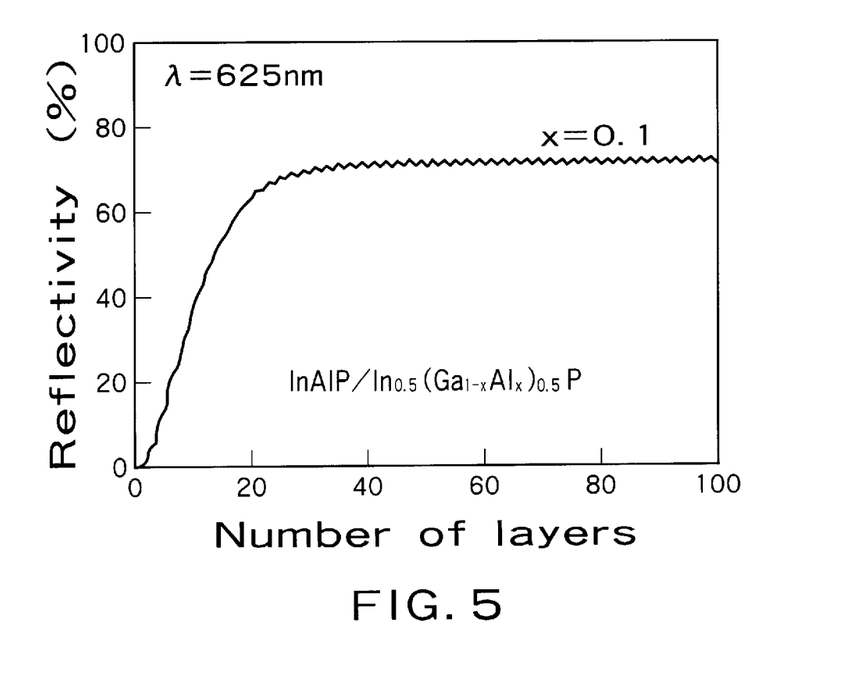
FIG. 5 is a graph of a reflectivity characteristic of a multi-layered film 102 to rays of light having a wavelength of 625 nm.

FIG. 5 is a graph of a reflectivity characteristic of a multi-layered film of alternately laminated $In_{0.5}$ $(Ga_{0.9}Al_{0.1})_{0.5}P$ and InAlP layers to the rays of light having a wavelength of 625 nm. The horizontal axis represents the number of laminated pairs of first and second layers 102A and 102B while the vertical axis represents a reflectivity of the multi-layered film 102. The light having a wavelength of 625 nm corresponds to a typical wavelength of light emitted by the active layer 104, as described above. As will be seen in FIG. 5, as the number of pairs increases the reflectivity increases to be substantially saturated at about 20 pairs. It will be seen in FIG. 5 that the number of pairs is preferably 20 or more in order to increase the reflectivity of the multi-layered film. However, even when the number of pairs increases beyond 40, the reflectivity hardly increases and the manufacturing process becomes more complicated. Therefore, it will be seen that the number of pairs of first and second layers of the multi-layered film is preferably between 20 and 40, and more preferably about 30.

While in the semiconductor light emitting element of FIG. 4 the multi-layered film 102 is illustrated as including the laminated pairs of $In_{0.5}$ $(Ga_{0.95}Al_{0.05})_{0.5}P$ layers 102A and InAlP layers 102B, the $In_{0.5}$ $(Ga_{0.95}Al_{0.05})_{0.5}P$ layers 102A may be replaced with InGaAlP layers. The active layer 104 may be replaced with an InGaAlP active layer having a different composition to change the wavelength of light to be emitted.

In this way, the wavelength of light to be emitted can be changed so as to provide red, orange, yellow and green rays of light. It is to be noted that preferably, the difference in peak wavelength between the first light L1 from the active layer 104 and the second layers of light L2 from the InGaAlP layer 102A is in a range in which the spectrum of the mixed light emitted maintains a unimodal characteristic, as shown in FIGS. 2B–2E, or is smaller than 0.9 times a half width of the spectrum of the first light L1.

As described in FIG. 3, each $In_{0.5}$ $(Ga_{0.95}Al_{0.05})_{0.5}P$ layer 102A may be replaced with two InGaAlP layers different in composition. In this case, those two InGaAlP layers may each have a width of λ/8n.

In the semiconductor light emitting element of FIG. 4, the multi-layered film 102 may be replaced with another materials. For example, the following table shows materials of semiconductor layers 102A and 102B of the multi-layered film 102 usable when the active layer 104 emits rays of light having a wavelength of 625 nm:

| Semiconductor layer | Reflectivity | thickness (λ/4n) | thickness (λ/8n) |
|---|---|---|---|
| InAlP | 3.063 | 51.0 nm | 25.2 nm |
| $In_{0.5}$ $(Ga_{0.9}Al_{0.1})_{0.5}P$ | 3.297 | 47.4 | 23.7 |
| InGaP | 3.687 | 42.4 | 21.2 |
| $Al_{0.4}Ga_{0.6}As$ | 3.65 | 42.8 | 21.4 |

By selecting appropriate ones from the above-enumerated semiconductor materials in consideration of their reflectivity and combining them, the multi-layered films 102 usable in the present invention are obtained.

While in the semiconductor light emitting element of FIG. 4 the InGaAlP semiconductor light emitting element has been illustrated, the semiconductor light emitting element may be made of other materials. For example, InGaP, InGaAlP, InGaP and AlGaAs may be used as materials that match in lattice with the GaAs substrate 101.

Second Example

Figure 6:
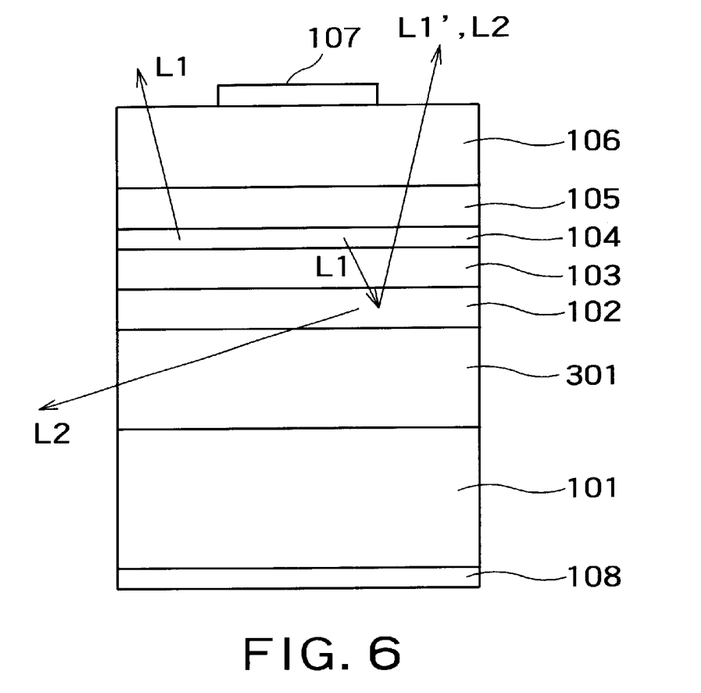
FIG. 6 is a schematic cross-sectional view of a semiconductor light emitting element taken as a second example of the invention.

An InGaAlP LED having a window layer as a second example of the present invention will be described next. FIG. 6 is a schematic cross-sectional view of a semiconductor light emitting element taken as a second example of the invention. Like components of second example and first example (FIG. 4) are denoted by the same reference numeral and further description thereof will be omitted.

The light emitting element of the second example is different from that of the first example in that an n-type GaAlAs window layer 301 is provided between the GaAs substrate 101 and the n-type InAlP clad layer 102. The n-type GaAlAs window layer 301 may have a thickness of about 10 μm, for example.

In the example, the second light L2 in the multi-layered film 102 can be selectively extracted from a side of the element. That is, the efficiency of selectively extracting only the second light L2 from the multi-layered film 102 is increased.

The brightness of the semiconductor light emitting element taken as a second example at an operating current of 20 mA is 10 cd in a package with a radiation angle of 10°, and corresponds to about 4 times of the conventional light emitting element shown in FIG. 8.

While the n-type GaAlAS window layer 301 has been illustrated in the semiconductor light emitting element of FIG. 6, various materials such as InGaAlP and GaAsP may be used for the window layer depending on the wavelength of light to be emitted by the active layer.

Third Example

Gallium nitride compound LEDs as a third example of the present invention will be described next. The gallium nitride compound LEDs are capable of emitting purely green, blue, ultraviolet rays of light, etc.

Figure 7:
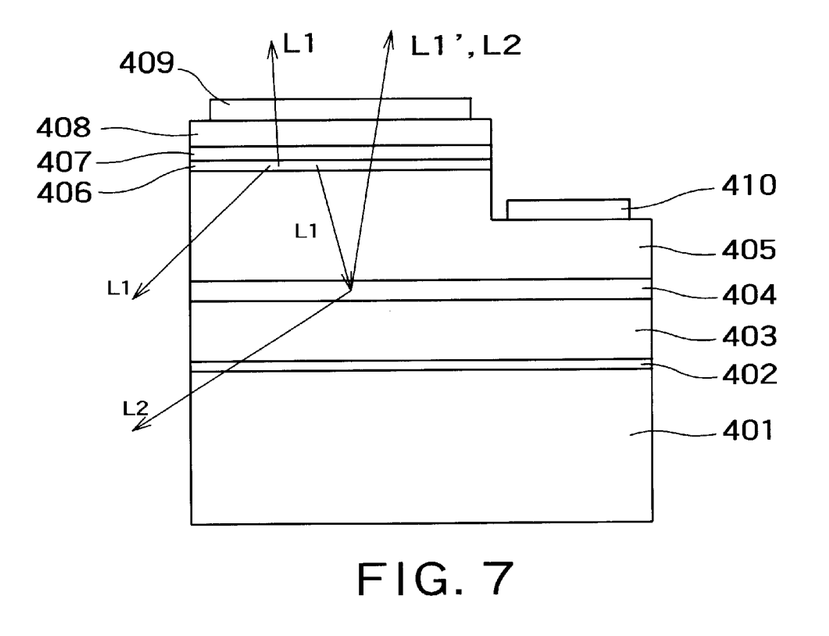
FIG. 7 is a schematic cross-sectional view of a semiconductor light emitting element taken as a third example of the invention.

FIG. 7 is a schematic cross-sectional view of a semiconductor light emitting element taken as a third example of the invention. The gallium nitride compound LED includes a lamination of a buffer layer 402, a GaN underlying layer 403, an InGaN/GaN multi-layered film (light absorbing and emitting section) 404, an n-type GaN contact and clad layer 405, an InGaN active layer 406, a p-type AlGaN clad layer 407, a p-type GaN contact layer 408, deposited in this order on a sapphire substrate 401. A p-side electrode 409 is provided on the p-type contact layer 406. In the element of FIG. 7, the p-side electrode 409 is made of a transparent material and has a wide area in order to uniformly inject current to the active layer 402. The n-side electrode 410 is provided on an etched and exposed part of the n-type GaN contact layer 405 of the element. Although the sapphire substrate 401 is of the insulating type, the provision of the n-type electrode 410 on the n-type contact layer 405 allows a current to be injected into the active layer 406. The active layer 406 emits first light L1 having a wavelength of $\lambda$ by current injection through the n-side electrode 410 and the p-side transparent electrode 410. In this example, $\lambda$ is about 470 nm, which provides blue rays of light. The first or blue light is taken through the p-side transparent electrode 409 from the upper side of the element in FIG. 7.

The multi-layered film 404 includes a lamination of InGaN layer (first layer) and GaN layer (second layer) deposited alternately in this order. The second layer is different in band gap from the first layer, and the second layer is greater in band gap than the first layer. The second layer is different in refractive index from the first layer, and the refractive index $n_2$ of the second layer is smaller than the refractive index $n_1$ of the first layer. The first layer 102A has a thickness of $\lambda/4n_1$, or about 3 nm. The second layer 102B has a thickness of $\lambda/4n_2$, or about 5.5 nm. When the first and second layers have such thicknesses, the multi-layered film 404 exhibits a high reflectivity to the first light L1 having a wavelength of $\lambda$ emitted by the active layer 406. The n-type GaN contact and clad layer 405 formed on the multi-layered film 404 has a greater band gap than the active layer 406 to thereby confine the carriers to within the active layer 404. The active layer 406 formed on the n-type GaN contact and clad layer 405 has a greater band gap than the first layer of the multi-layered film 404. Thus, one part of the first light L1 from the active layer 406 is absorbed by the multi-layered film 404, which then emits second light L2 having a greater wavelength than the first light L1 from the first layer. The multi-layered film 404 reflects the remaining part of the first light L1 upward from the active layer 406 as a reflection L1' in FIG. 7. The difference in peak wavelength between the first light L1 and the second light L2 is in a range in which the spectrum of the mixed light maintains a unimodal characteristic, or is smaller than about 0.9 times a half width of the spectrum of the first light L1, as shown in FIGS. 2B–2E. In FIG. 7, the first light L1, the second light L2, and the reflection L1' are extracted upward from the upper side of the element through the p-type transparent electrode 409 and also from the edge side of the element. The p-type AlGaN clad layer 407 formed on the active layer 406 has a greater band gap than the active layer 406 to thereby confine the carriers to within the active layer 406.

The method of making the semiconductor light emitting element of FIG. 7 will be explained next. In this example, the semiconductor light emitting element is grown in MOCVD. The growing materials usable may be, for example, trimethylgallium or triethylgallium as Ga source; trimethylindium or triethylindium as In source; trimethylaluminum or triethylaluminum as Al source; ammonia or hydrazine as N source; monosilane as n-type impurity (dopant); and biscyclopentadienylmagnesium as p-type impurity, respectively. The method of making the semiconductor light emitting element will be outlined below.

First, a sapphire substrate 401 is cleaned with an organic solvent or sulfuric-acid-based etchant and then introduced into the MOCVD chamber. The substrate 401 is then heated to 1100° C. to thereby be subjected to thermal cleaning. When an N material and relevant Group-III materials are flowed into the chamber at temperatures appropriate for the respective layers to thereby grow a laminated structure. The composition of the InGaN layer that composes the active layer 406 is adjusted so that the light emitted by the active layer 406 has a wavelength of about 470 nm. The growing thicknesses and growing temperatures of those layers are as follows:

| | | |
|---|---|---|
| buffer layer 402 | 30 nm | 500° C. |
| GaN underlying layer 40 | 1 $\mu$m | 1050° C. |
| InGaN/GaN multi-layered film 404 | | |
| InGaN layer | 3 nm | 750° C. |
| GaN layer | 5.5 nm | 750° C. |
| n-type GaN layer 405 | 4 $\mu$m | 1050° C. |
| InGaN active layer 406 | | |
| InGaN active layer | 3 nm | 750° C. |
| GaN layer | 8 nm | 750° C. |
| p-type AlGaN clad layer 407 | 50 nm | 1050° C. |
| p-type GaN contact layer 408 | 150 nm | 1050° C. |

As described above, in the semiconductor light emitting element of FIG. 7 the respective layers can be laminated continuously on the sapphire substrate 401 in a single crystal growth process. Therefore, even when the multi-layered film 404 is provided, the manufacturing time, yield and productivity are hardly reduced. Then, electrodes 409 and 910 are formed to provide the finished element.

The semiconductor light emitting element of FIG. 7 described above has a high light extraction efficiency. In addition, with the element of FIG. 7 the manufacturing time is reduced and the productivity is improved. In greater detail, since the element of FIG. 7 comprises the multi-layered film 404, the first light L1 from the active layer 406, the second light L2 from the multi-layered film 404 and the reflected rays of light L1' can be taken from the upper side of the element in FIG. 7 to thereby increase the light extraction efficiency. Since the multi-layered film 404 is easy to form in the element of FIG. 7, the manufacturing time is reduced and the productivity is improved.

Likewise, the light extraction efficiency of the conventional gallium nitride semiconductor light emitting elements is relatively high because the sapphire substrate 401 of the gallium nitride semiconductor light emitting element is transparent to the ight from the active layer 106. The conventional elements, however, requires a complicated process that includes forming a metal reflective layer on the back of the substrate and working in a special manner to reflector on which the element is mounted in order to improve the light extraction efficiency. Thus, the manufacturing time increases and the yield and productivity are reduced.

As described above, the multi-layered film 404 used in the present example is useful in the semiconductor light emitting elements using an transparent substrate as well as in the semiconductor light emitting elements using a opaque substrate 401.

When a bias is applied to the light emitting element of this example, blue light having a wavelength of 470 nm is obtained through the p-side electrode 409. The intensity of light emitted at an operating current of 20 mA is 1.0 mW.

While in the semiconductor light emitting element of FIG. 7 the wavelength of light emitted is illustrated as being 470 nm or blue, purely green, blue or ultraviolet light can be emitted by changing the indium content of the active layer 406. In addition, by increasing the indium content, red light can be obtained. Preferably, the difference in peak wavelength between the first light L1 from the active layer 406 and the second light L2 from the first layer of the multi-layered film 402 is in a range in which the spectrum of the mixture of the first and second light L1 and L2 maintains a unimodal characteristic, as shown in FIGS. 2B–2E, or is smaller than 0.9 times a half width of the spectrum of the first light L1.

While the semiconductor light emitting element of FIG. 7 is illustrated as using the sapphire substrate 401, similar effects to those produced by this element can be produced by GaN light emitting elements having a SiC or GaN substrate. The respective laminated layers 401–408 may be replaced with other gallium nitride compound semiconductors that comprise nitrogen and gallium.

Fourth Example

As will be seen in FIG. 8, one of the points where the semiconductor light emitting element of the fourth example is different from the third example is that the fourth example uses an n-type Si substrate 501, which is opaque to the light from the active layer 506, but that large substrates are available at low cost, advantageously.

FIG. 8 is a schematic cross-sectional view of a semiconductor light emitting element taken as a fourth example of the invention. The element shown in FIG. 8 is a gallium nitride compound semiconductor using the n-type Si substrate 501. A face orientation of the substrate is selected so as to be (111). The lattice mismatching between gallium nitride compound semiconductor and Si substrate 501 is about 20%, but it is known that gallium nitride compound semiconductor can grow on the Si substrate 501 by forming relevant buffer layer 502. The n-type Si substrate 501 is opaque to the light from the active layer 506. The laminate composition made of the multi-layered film 503-the p-type GaN contact layer 508 is similar to the corresponding composition of the third embodiment and further description thereof will be omitted. The p-type electrode 509 is formed on the p-type GaN contact layer 508 and is made of conductive metal. Since the electrode 509 is opaque to the first light L1 from the active layer 506, its area is reduced. The n-side electrode 510 is provided on the underside of the n-type Si substrate 501 so as to cover the entire area of the substrate in FIG. 8. Since the n-side electrode 510 has a wide area and the electrodes 509 and 510 are formed on the upper and lower sides of the FIG. 8 element respectively, current can be uniformly injected to the active layer 506 and an uniform distribution of the light emitted is obtained, even when the area of the p-side electrode 509 is reduced to some extent.

The semiconductor light emitting element of FIG. 8 described above provides high light extraction efficiency and reduces the cost greatly. That is, the n-type Si substrate 501 is used widely in the industry of semiconductors, and large substrates are available at low cost and easy to work. Since the substrate 501 is made of an electrically conductive material, a pair of electrodes 509 and 510 are each easy to form at a respective one of upper and lower positions on the element. Thereby the cost can be greatly reduced. Since the element of FIG. 8 includes the multi-layered film 501, the first light L1 from the active layer 506, the second light L2 from the multi-layered film 501 and the reflection L1' of the first light L1 can be taken from the upper side of the element to increase the light extraction efficiency.

In contrast, when the conventional gallium compound semiconductor light emitting element free from a multi-layered film such as 504 used an n-type Si substrate such as 501, the light extraction efficiency lowered because the substrate 501 is opaque to the first light L1 from the active layer 506.

When a bias is applied to the semiconductor light emitting element of this example, blue light having a wavelength of 470 nm is obtained through the p-side electrode 509. The intensity of the light emitted at an operating current of 20 mA is 1.0 mW, which is twice of the conventional element free from a multi-layered film such as 504.

While in the semiconductor light emitting element of FIG. 8 described above the semiconductor light emitting element using the n-type Si substrate 501 is illustrated, similar effects to those produced by the element are produced by Ga nitride semiconductor light emitting elements using a GaAs substrate.

While in the semiconductor light emitting element of FIG. 8 the use of the opaque p-side electrode 509 is illustrated, a transparent electrode similar to that of the third embodiment (FIG. 7) may be used instead.

While the embodiments and examples of the present invention are explained, the present invention is not limited to those examples.

For example, while the several multi-layered films (light absorbing and emitting sections) are illustrated in the first-fourth examples, similar effects to those produced by the multi-layered films are produced by combinations of selected ones of other possible multi-layered films depending on wavelengths of light emitted by the active layers and other structural parameters. The light absorbing and emitting section in the present invention is not necessarily required to include a multi-layered film, but may be a single semiconductor layer having a light absorbing and emitting function.

The present invention is not limited to the materials and wavelength as disclosed in the above examples, the wavelengths of light emitted from active layer may be determined depending on the characteristics of the materials. For example, the present invention is not limited to the light emitting elements using the compound semiconductors for Groups III–V, but are applicable to light emitting elements using various semiconductor materials including the semiconductor materials for Groups II–VI and IV–VI.

The inventive is not limited to the above-mentioned LEDs, but applicable to various light emitting elements such as semiconductor lasers as well as photo acceptance element, optical modulating elements and other electronic elements.

Various changes and modifications are possible without departing from the spirit and scope of the invention.

What is claimed is:

1. A semiconductor light emitting element comprising:
   an active layer for emitting first light by current injection; and
   a light absorbing and emitting section for absorbing one part of the first light and for emitting second light having a greater peak wavelength than the first light,
   wherein a difference in peak wavelength between the first light and the second light is in a range in which a spectrum of a mixture of the first and second light maintains a unimodal characteristic.

2. The semiconductor light emitting element according to claim 1, wherein said light absorbing and emitting section comprises an alternate lamination of first and second semiconductor layers, each said second semiconductor layer having a greater band gap than each said first semiconductor layer, and any of said first semiconductor layers emit the second light.

3. A The semiconductor light emitting element according to claim 2, wherein a refractive index $n_1$ of each of said first semiconductor layers of said light absorbing and emitting section is different from a refractive index $n_2$ of each of said second semiconductor layers so that said light absorbing and emitting section reflects a remaining part of the first light.

4. The semiconductor light emitting element according to claim 3, wherein the first light has a peak wavelength of $\lambda$, each of said first semiconductor layers of said light absorbing and emitting section has a thickness of $\lambda/4n_1$ and each of said second semiconductor layers of said light absorbing and emitting section has a thickness of $\lambda/4n_2$.

5. The semiconductor light emitting element according to claim 4, wherein the refractive index $n_1$ of each of said first semiconductor layers of said light absorbing and emitting section is greater than the refractive index $n_2$ of each of said second semiconductor layers.

6. The semiconductor light emitting element according to claim 5, wherein said active layer is made of InGaAlP, each of said first semiconductor layers of said light absorbing and emitting section is made of InGaAlP, and each of said second semiconductor layers is made of InAlP.

7. The semiconductor light emitting element according to claim 5, wherein each of said first semiconductor layers of said light absorbing and emitting section comprises a plurality of sublayers.

8. A semiconductor light emitting element comprising:
an active layer for emitting first light by current injection; and
a light absorbing and emitting selection for absorbing one part of the first light and for emitting second light having a greater peak wavelength than the first light,
wherein a difference in peak wavelength between the first light and the second light is smaller than 0.9 times a half width of a spectrum of the first light.

9. A semiconductor light emitting element comprising:
a GaAs substrate opaque to first light having a wavelength of $\lambda$;
a light absorbing and emitting section formed on said GaAs substrate and matching in lattice with said GaAs substrate, said light absorbing and emitting section comprising an alternate lamination of first and second layers, each of said first layers having a reflective index of $n_1$ and a thickness of $\lambda/4n_1$, each of said second layers having a refractive index of $n_2$ ($n_2<n_1$) and a thickness of $\lambda/4n_2$, each of said second layers having a greater band gap than each said first layer;
a first conductive-type clad layer formed on said light absorbing and emitting section and made of a semiconductor matching in lattice with said GaAs substrate;
an active layer formed on said first conductive-type clad layer and made of a semiconductor matching in lattice with said GaAs substrate for emitting the first light having a peak wavelength of $\lambda$ by current injection, said active layer having a band gap greater than each of said first layers of said light absorbing and emitting selection and smaller than said first conductive-type clad layer;
said light absorbing and emitting section absorbing one part of the first light from said active layer and emitting second light having a greater peak wavelength than the first light, said light absorbing and emitting section also reflecting a remaining part of the first light from said active layer; and
a second conductive-type clad layer formed on said active layer and made of a semiconductor matching in lattice with said GaAs substrate, said second conductive-type clad layer having a greater band gap than said active layer.

10. The semiconductor light emitting element according to claim 9,
wherein a difference in peak wavelength between the first light and the second light is smaller than 0.9 times a half width of a spectrum of the first light.

11. The semiconductor light emitting element according to claim 9,
wherein a difference in peak wavelength between the first light and the second light is in a range in which a spectrum of a mixture of the first and second light maintains a unimodal characteristic.

12. The semiconductor light emitting element according to claim 11, further comprising a window layer formed between said light absorbing and emitting section and said first conductive-type clad layer and made of a semiconductor matching in lattice with said GaAs substrate, said window layer having a greater band gap than that of said active layer.

13. The semiconductor light emitting element according to claim 11, wherein said light absorbing and emitting section comprises any one of InAlP, InGaAlP, InGaP and AlGaAs.

14. The semiconductor light emitting element according to claim 13, wherein said active layer is made of InGaAlP, each of said first semiconductor layers of said light absorbing and emitting section is made of InAlP, and each of said second semiconductor layers of said light absorbing and emitting section is made of InGaAlP.

15. The semiconductor light emitting element according to claim 13, wherein said light absorbing and emitting section comprises a lamination of at least 20 pairs of said first and second layers.

16. A semiconductor light emitting element comprising:
a substrate made of any one of sapphire, GaN and SiC;
a light absorbing and emitting section formed on said substrate and comprising an alternate lamination of first and second layers, each of said first and second layers being made of a gallium nitride compound semiconductor, each of said first layers having a refractive index of $n_1$, and a thickness of $\lambda/4n_1$, each of said second layers having a refractive index of $n_2$ ($n_2<n_1$) and a thickness of $\lambda/4n_2$, each of said second layers having a greater band gap than each said first layer;
a first conductive-type clad layer formed on said light absorbing and emitting section and made of a gallium nitride compound semiconductor;
an active layer formed on said first conductive-type clad layer and made of a gallium nitride compound semiconductors, said active layer omitting first light having a peak wavelength of $\lambda$ by current injection, said active layer having a greater band gap than each of said first layers of said light absorbing and emitting section and smaller than said first conductive-type clad layer;
said light absorbing and emitting section absorbing one part of the first light from said active layer and emitting second light having a greater peak wavelength than the first light, said light absorbing and emitting section also reflecting a remaining part of the first light from said active layer; and
a second conductive-type clad layer formed on said active layer and made of a gallium nitride compound semiconductor, said second conductive-type clad layer having a greater band gap than said active layer.

17. The semiconductor light emitting element according to claim 16,
wherein a difference in peak wavelength between the first light and the second light is smaller than 0.9 times a half width of a spectrum of the first light.

18. The semiconductor light emitting element according to claim 16,
wherein a difference in peak wavelength between the first light and the second light is in a range in which a spectrum of a mixture of the first and second light maintains a unimodal characteristic.

19. The semiconductor light emitting element according to claim 18, wherein said active layer is made of InGaN, each of said first layers of said light absorbing and emitting section is made of GaN, and each of said second layers of said light absorbing and emitting section is made of InGaN.

20. A semiconductor light emitting element comprising:
a substrate made of any one of Si and GaAs, said substrate being opaque to first light having a wavelength of $\lambda$;
a light absorbing and emitting section formed on said substrate and comprising an alternate lamination of first and second layers, each of said first and second layers being made of a gallium nitride compound semiconductor, each of said first layer having a refractive index of $n_1$ and a thickness of $\lambda/4n_1$, each of said second layers having a refractive index of $(n_2<n_1)$ and a thickness of $\lambda/4n_2$, each of said second layers having a greater band gap than each said first layer;
a first conductive-type clad layer formed on said light absorbing and emitting section and made of a gallium nitride compound semiconductor;
an active layer formed on said first conductive-type clad layer and made of a gallium nitride compound semiconductors, said active layer emitting first light having a peak wavelength of $\lambda$ by current injection, said active layer having a greater band gap than each of said first layers of said light absorbing arid emitting section and smaller than said first conductive-type clad layer;
said light absorbing and emitting section absorbing one part of the first light from said active layer and emitting second light having a greater peak wavelength than the first light, said light absorbing and emitting section also reflecting a remaining part of the first light from said active layer; and
a second conductive-type clad layer formed on said active layer and made of a gallium nitride compound semiconductors said second conductive-type clad layer having a greater band gap than said active layer.

21. The semiconductor light emitting element according to claim 20,
wherein a difference in peak wavelength between the first light and the second light is smaller than 0.9 times a half width of a spectrum of the first light.

22. The semiconductor light emitting element according to claim 20,
wherein a difference in peak wavelength between the first light and the second light is in a range in which a spectrum of a mixture of the first and second light maintains a unimodal characteristic.

23. The semiconductor light emitting element according to claim 22, wherein said active layer is made of InGaN, each of said first layers of said light absorbing and emitting section is made of GaN, and each of said second layers of said light absorbing and emitting section is made of InGaN.

* * * * *